(12) United States Patent
Ko

(10) Patent No.: US 8,058,949 B2
(45) Date of Patent: Nov. 15, 2011

(54) COMPACT RC NOTCH FILTER FOR QUADRATURE AND DIFFERENTIAL SIGNALING

(75) Inventor: Jenwei Ko, Cupertino, CA (US)

(73) Assignee: Mediatek Inc., Hsin-Chu (TW)

( * ) Notice: Subject to any disclaimer, the term of this patent is extended or adjusted under 35 U.S.C. 154(b) by 215 days.

(21) Appl. No.: 12/430,785

(22) Filed: Apr. 27, 2009

(65) Prior Publication Data

US 2010/0271151 A1     Oct. 28, 2010

(51) Int. Cl.
*H03H 7/01*     (2006.01)
*H03H 7/06*     (2006.01)

(52) U.S. Cl. ......... 333/172; 333/167; 327/552; 327/556

(58) Field of Classification Search .................. 333/172, 333/167; 327/552, 556
See application file for complete search history.

(56) References Cited

U.S. PATENT DOCUMENTS 4,123,712 A * 10/1978 Mikhael ........................ 455/109
7,127,226 B2 10/2006 Tolson

* cited by examiner

*Primary Examiner* — Robert Pascal
*Assistant Examiner* — Kimberly Glenn
(74) *Attorney, Agent, or Firm* — Sawyer Law Group, P.C.

(57) ABSTRACT

In varying embodiments, the present inventive concepts relate to a notch filter for quadrature and differential signaling. No inductor is used in this notch filter, thus the integrated circuits silicon die area is small. In addition, the linearity of the notch filter is excellent because of the linearity of the resistors and capacitors in integrated circuits.

12 Claims, 4 Drawing Sheets

COMPACT RC NOTCH FILTER FOR QUADRATURE AND DIFFERENTIAL SIGNALING

FIELD OF THE INVENTION

The invention relates to electrical filters, and more particularly to an arrangement of resistors and capacitors to compose a notch filter for quadrature and differential signaling.

BACKGROUND OF THE INVENTION

A notch filter is a band elimination or band stop filter, for attenuating or damping a part of a frequency band centered on a center frequency. Stated otherwise, the transfer function of a notch filter is flat at all frequencies except for the stop band on either side of the center frequency. The drastic attenuation of the filter response around the targeted frequency is called the notch.

Notch filters have been used for years in the signal processing of signals in a reverberant or high clutter background. A biquad notch filter is a notch filter with a two pole and two zero filter topology, i.e. with a s-domain transfer function with 2 as the highest exponent both in the numerator or denominator. Such a filter is characterized by the 2 poles and 2 zeros of its transfer function. The zeroes are directly linked to the band elimination capacities of the biquad notch filter. In quadrature signaling, in-phase (I) path and quadrature-phase (Q) path need two differential twin-T RC filters.

Series LC, Twin-T RC or differential twin-T RC filters are typically used to notch undesired tones in an RF system. FIGS. 1(a), 1(b), 1(c) respectively, show a series LC filter 110, a Twin-T RC filter 120 and a differential twin-T RC filter 130. However, these conventional implementations require an integrated inductor or a considerable number of components and consequently require a significant amount of area on the silicon die.

SUMMARY OF THE INVENTION

In varying embodiments, the present inventive concepts relate to a notch filter for quadrature and differential signaling. No inductor is used in this notch filter, thus the integrated circuits silicon die area is small. In addition, the linearity of the notch filter is excellent because of the linearity of the resistors and capacitors in integrated circuits.

A first embodiment is a notch filter for filtering a signal in an RF circuit comprising an outer arrangement of resistors and capacitors, an inner arrangement of resistors and capacitors coupled to the outer arrangement and wherein the outer arrangement notches a first component of the signal and the inner arrangement notches a second component of the signal.

A second embodiment is a filter arrangement for filtering a signal in an RF circuit comprising an outer filter for filtering a first component of the signal and an inner filter coupled thereto for filtering a second component of the signal.

Other aspects and advantages of the present invention will become apparent from the following detailed description, taken in conjunction with the accompanying drawings, illustrating by way of example the principles of the invention.

DETAILED DESCRIPTION

The present disclosure relates to a notch filter for quadrature and differential signaling. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In varying embodiments, the present inventive concepts relate to a notch filter for quadrature and differential signaling. No inductor is used in this notch filter, thus the integrated circuits silicon die area is very small. In addition, the linearity of the notch filter is excellent because of the very linear resistors and capacitors in integrated circuits.

Figure 1:
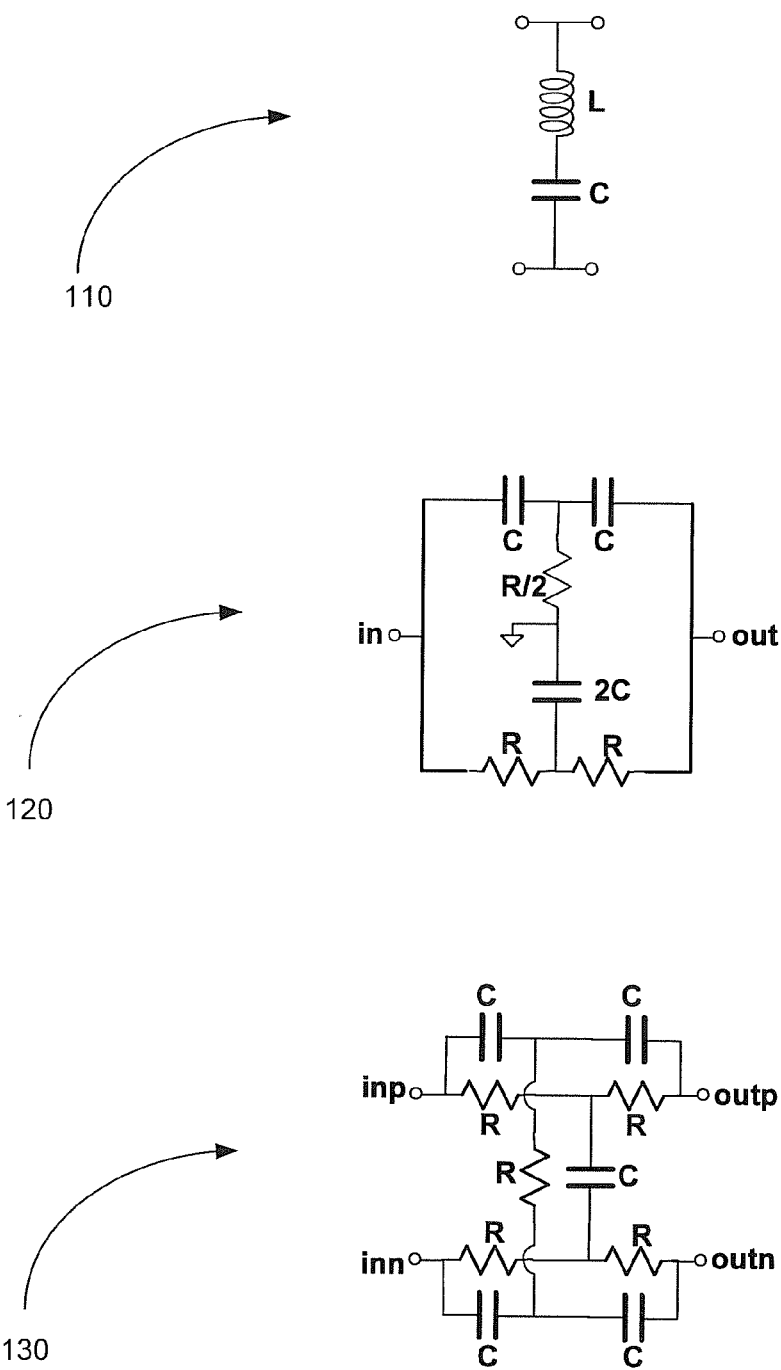
FIG. 1 shows conventional series LC, twin-T and differential twin-T RC notch filters.
Figure 2:
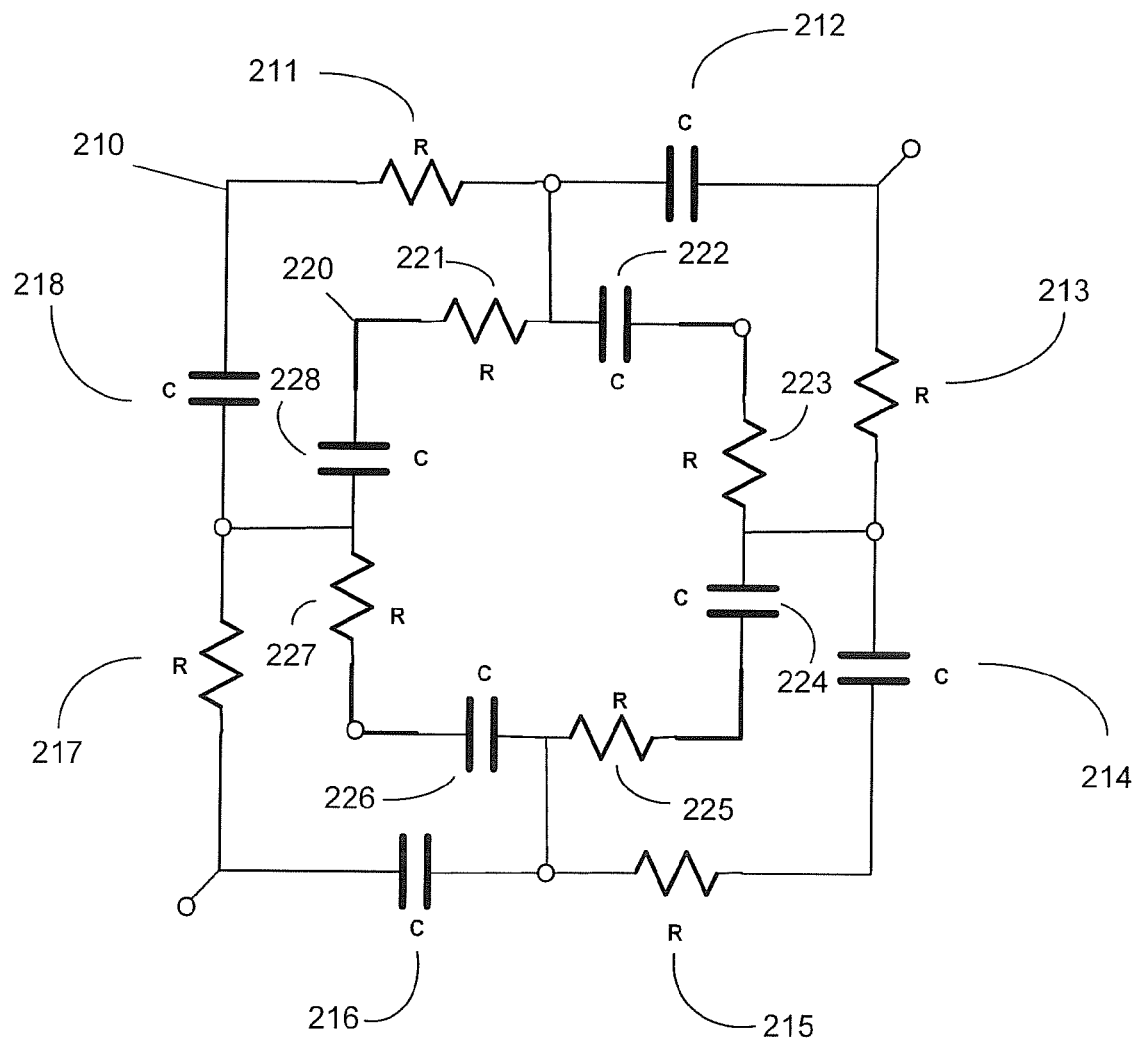
FIG. 2 shows an arrangement of resistors and capacitors to compose a RC notch filter for both differential and quadrature signaling in accordance with an embodiment of the present invention.

FIG. 2 shows a notch filter 200 in accordance with an embodiment of the present invention. The notch filter 200 includes an outer arrangement 210 of resistors and capacitors coupled to an inner arrangement 220 of resistors and capacitors. The outer arrangement 210 includes resistors 211, 213, 215, 217 and capacitors 212, 214, 216, 218. The inner arrangement 220 includes resistors 221, 223, 225, 227 and capacitors 222, 224, 226, 228.

The operation of the notch filter 200 will be discussed in terms of "in-phase" and "quadrature-phase" signaling. The term in-phase is also found in the context of communication signals:

$$A(t) \cdot \sin[2\pi ft + \phi(t)] = I(t) \cdot \sin(2\pi ft) + Q(t) \cdot \underbrace{\cos(2\pi ft)}_{\sin(2\pi ft + \frac{\pi}{2})}$$

and:

$$A(t) \cdot \cos[2\pi ft + \phi(t)] = I(t) \cdot \cos(2\pi ft) \underbrace{- Q(t) \cdot \sin(2\pi ft)}_{+Q(t) \cdot \cos(2\pi ft + \frac{\pi}{2})},$$

where f represents a carrier frequency, and $$I(t) \stackrel{def}{=} A(t) \cdot \cos(\phi(t)),$$

$$Q(t) \stackrel{def}{=} A(t) \cdot \sin(\phi(t)).$$

A(t) and φ(t) represent possible modulation of a pure carrier wave, e.g.: sin(2πft). The modulation alters the original sin component of the carrier, and creates a (new) cos component, as shown above. The component that is in phase with the original carrier is referred to as the in-phase component. The other component, which is always 90° (π/2 radians) "out of phase", is referred to as the quadrature component.

For example, the notch filter 200 signaling could have a phase relationship whereby the first phase sequence is in a counter-clockwise direction and the second phase sequence is in a clockwise direction. However, one of ordinary skill in the art will readily recognize that a variety of signaling relationships could be employed while remaining within the spirit and scope of the present inventive concepts.

As compared to conventional quadrature twin-T RC notch filters, the present invention consumes less RC components. Most importantly, in the present invention, the components mismatch between the I path and the Q path is averaged and thus reduced. On the other hand, conventional quadrature twin-T RC notch filter always adds mismatch by using more components without averaging between I and Q. Low mismatch between I and Q path is always desired in high data rate RF transceiver. As a result, this compact notch filter 200 is suitable for RF integrated circuits applications.

Application of Differential Signals to Notch Filter

Figure 3:
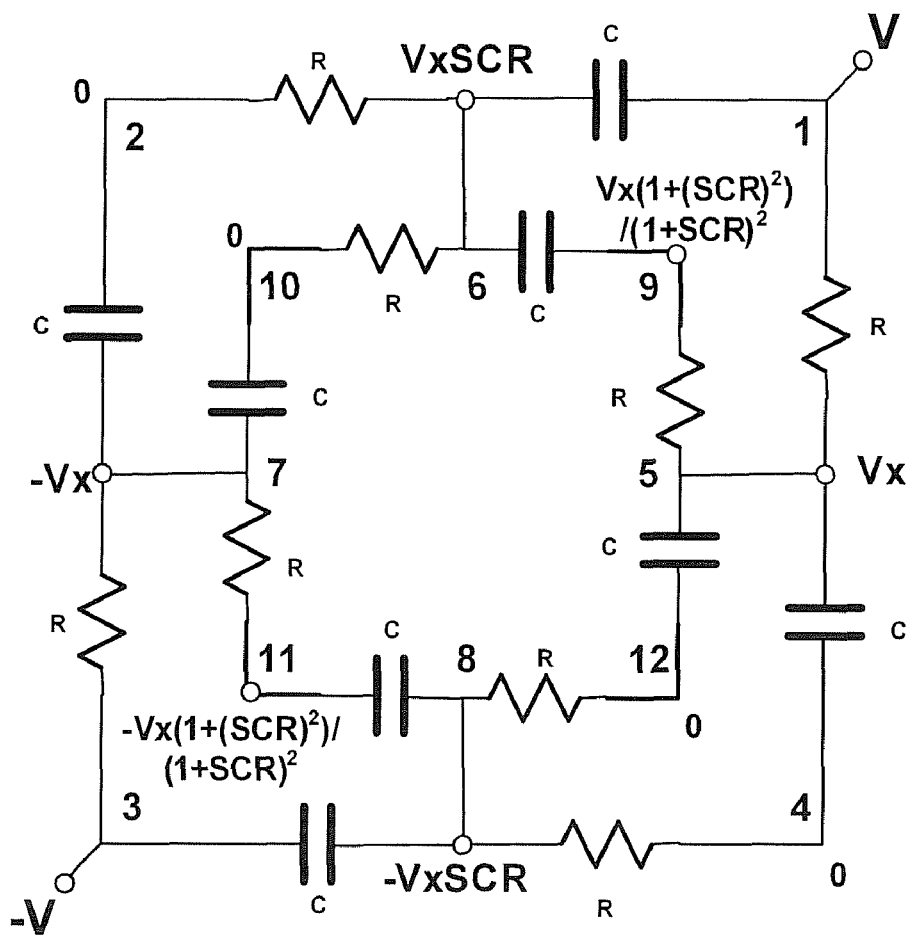
FIG. 3 shows an application of V and −V differential signals to the notch filter in accordance with an embodiment of the present invention.

For a better understanding, of the operation please refer to FIG. 3. In an embodiment, the notch filter 300 has 12 nodes as shown in FIG. 3. When differential voltage signals V and −V are applied to nodes 1 and 3, each node voltage can be calculated using symmetry property and Laplace Transform. Based on the observation of the RC network in FIG. 3, the notch filter nodes 5, 6, 7 and 8 are shown as Vx, VxSRD, −Vx, and −VxSCR, where Vx is an unknown parameter. Nodes 2, 4, 9, 10, 11, and 12 are calculated using Kirchhoff's circuits law where node 9 is $$V_x(1+(SCR)^2)/(1+SCR)^2$$

and node 11 is $$-V_x(1+(SCR)^2)/(1+SCR)^2$$

Consequently, using Kirchhoff's current law at either node 5, 6, 7 or 8, $V_x$ is calculated $$V_x=V(1+SCR)/(1+4SCR+(SCR)^2)$$

It should be noted that the differential output is difference between node 9 and 11, the notch filter differential transfer function is $(1+(SCR)2)/(1+4SRC+(SCR)2)$, and the notch frequency, ω, is 1/RC (rad/s). Consequently, where Vx=V(1+SCR)/(1+4SCR+(SCR)2) and the differential Input=2V, the differential output, Do, is calculated $$D_o=2Vx(1+(SCR)^2)/(1+SCR)=2V(1+SCR)^2)/(1+4SCR+(SCR)^2)$$

wherein a differential transfer function, $D_T$, of the notch filter is calculated $$D_T=(1+(SCR)^2)/(1+4SCR+(SCR)^2)$$

Application of Quadrature Signals to Notch Filter

Figure 4:
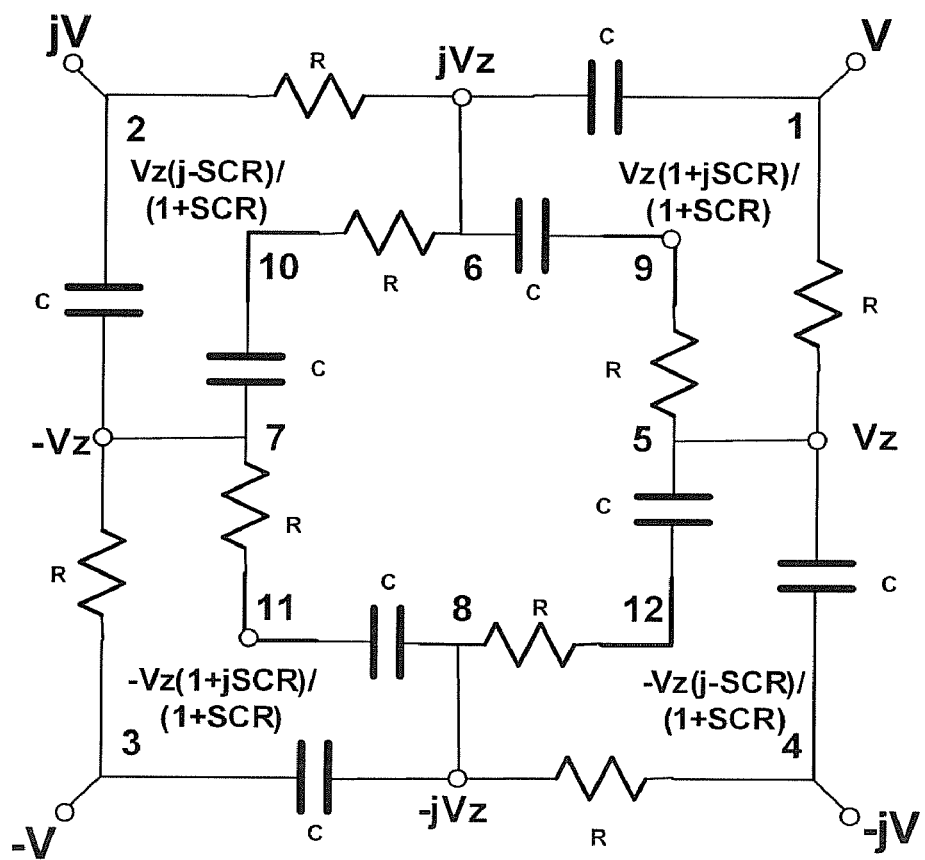
FIG. 4 shows an application of V, −V, jV, and −jV quadrature signals to the notch filter in accordance with an embodiment of the present invention.

For a better understanding of the operation, please refer now to FIG. 4. In an embodiment, the notch filter 400 has 12 nodes as shown in FIG. 4. Quadrature voltage signals V, jV, −V and −jV are applied to nodes 1, 2, 3, and 4 and nodes 5, 6, 7 and 8 are assumed to be Vz, jVz, −Vz and −jVz, respectively, where Vz is an unknown parameter. Nodes 9, 10, 11 and 12, calculated using Kirchhoff's circuits law where node 9 is $$V_z(1+jSCR)/(1+SCR)$$

node 10 is $$V_z(j-SCR)/(1+SCR)$$

node 11 is $$-V_z(1+jSCR)/(1+SCR)$$

and node 12 is $$-V_z(j-SCR)/(1+SCR)$$

Consequently, using Kirchhoff's current law at either node 5, 6, 7 or 8, $V_z$ is calculated $$V_z=V(1-jSCR)(1+SCR)/(1+4SCR+(SCR)^2)$$

In-phase and quadrature-phase differential output pairs are the difference between node 9 and 11 and the difference between node 10 and 12 respectively where the notch filter in-phase and quadrature-phase transfer functions are $(1+(SCR)2)/(1+4SCR+(SCR)2)$. Consequently, where Vz=V(1−jSCR)(1+SCR)/(1+4SCR+(SCR)2) and the in-phase Differential Input (node 1-node 3)=2V, the in-phase Do (node 9-node 11) is calculated $$D_o=2Vz(1+jSCR)/(1+SCR)=2V(1+(SCR)^2)/(1+4SCR+(SCR)^2)$$

Furthermore, where the quadrature-phase Differential Input (node 2-node 4)=2jV, the quadrature-phase $D_o$ (node 10-node 12) is calculated $$D_o=2jVz(1+jSCR)/(1+SCR)=2jV(1+(SCR)^2)/(1+4SCR+(SCR)^2)$$

wherein an in-phase and quadrature-phase differential transfer function, $D_T$, of the notch filter is calculated $$D_T=(1+(SCR)^2)/(1+4SCR+(SCR)^2)$$

The present invention minimizes silicon die area as a RC notch filter. This RC notch filter is especially suitable for quadrature signaling applications, where both I path and Q path need a notch filter. Instead of ten resistors and ten capacitors in conventional quadrature twin-T RC notch filter, the present invention needs only eight resistors and eight capacitors. In addition, the signals at the output of the notch filter maintain their quadrature phase relationship, which is desirable for data communication with I/Q modulation.

Without further analysis, the foregoing so fully reveals the gist of the present inventive concepts that others can, by applying current knowledge, readily adapt it for various applications without omitting features that, from the standpoint of prior art, fairly constitute essential characteristics of the generic or specific aspects of this invention. Therefore, such applications should and are intended to be comprehended within the meaning and range of equivalents of the following claims. Although these inventive concepts have been described in terms of certain embodiments, other embodiments that are apparent to those of ordinary skill in the art are also within the scope of this invention, as defined in the claims that follow.

What is claimed is:

1. A notch filter for filtering a signal in an RF circuit comprising:
   an outer arrangement of resistors and capacitors; and
   an inner arrangement of resistors and capacitors coupled to the outer arrangement wherein the outer arrangement notches a first component of the signal and the inner arrangement notches a second component of the signal, wherein the first component of the signal comprises an in-phase component and the second component of the signal comprises a quadrature phase component.

2. The notch filter of claim 1 wherein the outer arrangement of resistors and capacitors comprises 4 resistors and 4 capacitors.

3. The notch filter of claim 1 wherein the inner arrangement of resistors and capacitors comprises 4 resistors and 4 capacitors.

4. The notch filter of claim 1 wherein the first component of the signal and the second component of the signal have a phase relationship.

5. The notch filter of claim 4 wherein the phase relation comprises a counter-clockwise direction for the first component of the signal and a clockwise direction for the second component of the signal.

6. A filter arrangement for filtering a signal in an RF circuit comprising:
- an outer filter for filtering a first component of the signal; and
- an inner filter coupled thereto for filtering a second component of the signal, wherein the first component of the signal comprises an in-phase component and the second component of the signal comprises a quadrature phase component.

7. The filter arrangement of claim 6 wherein the outer filter comprises 4 resistors and 4 capacitors.

8. The filter arrangement of claim 6 wherein the inner filter comprises 4 resistors and 4 capacitors.

9. The filter arrangement of claim 6 wherein the first component of the signal and the second component of the signal have a phase relationship.

10. The filter arrangement of claim 9 wherein the phase relation comprises a clockwise direction for the first component of the signal and a counter-clockwise direction for the second component of the signal.

11. A notch filter for filtering a signal in an RF circuit comprising:
- an outer arrangement of resistors and capacitors; and
- an inner arrangement of resistors and capacitors coupled to the outer arrangement wherein the outer arrangement notches a first component of the signal and the inner arrangement notches a second component of the signal, wherein the first component of the signal and the second component of the signal have a phase relationship, wherein the phase relation comprises a counter-clockwise direction for the first component of the signal and a clockwise direction for the second component of the signal.

12. A filter arrangement for filtering a signal in an RF circuit comprising:
- an outer filter for filtering a first component of the signal; and
- an inner filter coupled thereto for filtering a second component of the signal, wherein the first component of the signal and the second component of the signal have a phase relationship, wherein the phase relation comprises a clockwise direction for the first component of the signal and a counter-clockwise direction for the second component of the signal.

* * * * *